United States Patent [19]

Bach, Jr.

[11] 4,266,295
[45] May 5, 1981

[54] CONTINUOUS TUNING CONTROL PARTICULARLY ADAPTED FOR USE IN VARIABLE FREQUENCY RECEIVERS AND GENERATORS

[76] Inventor: Henry M. Bach, Jr., P.O. Box 2174, Princeton, N.J. 08540

[21] Appl. No.: 970,269

[22] Filed: Dec. 18, 1978

[51] Int. Cl.³ .............................................. H04B 1/26
[52] U.S. Cl. .................................. 455/158; 455/173; 455/176; 455/192; 455/261; 331/30; 334/48
[58] Field of Search ............... 334/14, 15, 48; 331/30, 331/31, 36 C; 455/170, 173, 176, 177, 178, 192, 197, 261, 262, 158; 325/453, 455, 458–460, 462–465, 468, 420, 421, 422, 469, 470, 432, 433

[56] References Cited

U.S. PATENT DOCUMENTS

| | | | |
|---|---|---|---|
| 2,505,754 | 5/1950 | Combs | 325/453 |
| 3,008,043 | 11/1961 | Caulk | 325/421 |
| 3,233,179 | 2/1966 | Klettke | 325/422 |
| 3,409,836 | 11/1968 | Wallet | 325/453 |
| 3,505,621 | 4/1970 | Miner | 325/422 |
| 3,651,411 | 3/1972 | Zlotnick | 455/169 |
| 3,750,030 | 7/1973 | Worcester | 325/422 |
| 3,835,384 | 9/1974 | Liff | 325/453 |
| 4,081,752 | 3/1978 | Sumi | 325/470 |
| 4,175,254 | 11/1979 | Manfreda | 325/455 |

Primary Examiner—Jin F. Ng
Attorney, Agent, or Firm—Arthur L. Plevy

[57] ABSTRACT

This disclosure describes a continuous tuning arrangement for a variable frequency response circuit of the type covering a relatively wide frequency range. Many techniques for accommodating a wide frequency range are known and include synthesizers, waveform generators and so on which employ various coarse tuning controls or devices for band selection. A synthesizer is described which employs a continuous tuning means enabling one to continuously tune the circuit from a first frequency to a second frequency or from said second frequency to said first in a rapid manner, whereby continuous tuning is afforded without the necessity of returning the tuning control to a start position each time a new frequency is selected by the coarse tuning control. The continuous tuning means provided according to this disclosure incorporates a variable reactance device in which the magnitude of the control voltage is alternated according to a change from the first frequency to the second frequency as accommodated by said coarse control. In another embodiment, continuous tuning is provided again from a low to a higher frequency by means of a differential capacitor.

16 Claims, 4 Drawing Figures

Fig. 4.

CONTINUOUS TUNING CONTROL PARTICULARLY ADAPTED FOR USE IN VARIABLE FREQUENCY RECEIVERS AND GENERATORS

BACKGROUND OF THE INVENTION

This invention relates to a variable frequency response circuit and more particularly to such a circuit employed in a variable frequency generator, such as a signal generator, or a receiver.

The prior art is replete with a number of electric wave generators and radio receivers which may be digitally tuned and also provide a direct digital display of the frequency to which the device is tuned to or is responding to. Examples of such receivers and signal generators are many and many large corporations presently manufacture and sell both waveform generators and receivers employing direct digital display in connection with switch control tuning means.

Generally, both the receivers and the generators are designed to operate over a relatively wide frequency range and are varied in frequency over this range in coarse steps by utilizing a first frequency control means and may be varied continuously within each coarse step by employing a second frequency control means. In the case of radio receivers, certain receivers such as the DR 22 and the DR 33 as manufactured by McKay Dymek Co. of Pomona, Calif. employ a synthesizer to provide first local oscillator tuning in such a receiver. This approach is, of course, employed by many other manufacturers of similar devices.

The conventional synthesizer includes switching means which consist of a plurality of independent rotary switches. A first switch may be a multipositioned switch and operates to vary the frequency of a first local oscillator in 10 MHz steps. Hence, by setting this switch in one of its three positions, one may obtain a reading of zero, one, or two which is indicative of the lead digit in the 10 MHz band. A second switch is included which includes ten positions for varying the frequency of the first local oscillator in 1 MHz steps, as zero to nine. The third switch also includes ten positions and varies the frequency of the local oscillator in 100 KHz steps (zero to nine). A fourth switch includes twenty positions and varies the frequency of the first local oscillator in 10 KHz steps. The fourth switch also operates to vary the frequency of a second oscillator between a first frequency and a second higher frequency to provide 5 KHz steps. One can therefore tune the receiver in multidigit increments over a wide frequency range in 5 KHz intervals. Such a receiver, for example, may encompass a frequency range of operation from 50 KHz or lower to 30 MHz.

Hence, one can tune such a receiver by accessing the above described switches and rotating the same to a desired frequency. For example, if one desired to tune the receiver to a frequency of 27.41571 MHz, one would place switch 1 at position 2 indicative of 20 MHz. The second switch would be placed at position 7 indicative of 7 MHz. A third switch would be placed at position 4 indicative of 400 KHz and the fourth switch would be placed in the position indicative of 15 KHz. The tunable second oscillator enables tuning between 0 and 5 KHz to enable one to set the frequency to 27.41571 MHz and hence, to accurately specify the last two digits of the display. Thus, one would now read on the digital display associated with the receiver, the output frequency of 27.41571 MHz.

In such a receiver, a continuous tuning means is provided by a variable control. This continuous tuning means spans the 5 KHz intervals as specified by the fourth switch. This enables the user to perform fine tuning over the range indicated by the last two digits of the display to enable the user to accurately specify the frequency. This is especially important in responding to single sideband transmissions.

In such prior arrangements, it is necessary in tuning through a frequency range to first advance or retard the coarse frequency switch one position and then use the continuous tuning means to perform fine tuning from the low frequency end to the upper frequency end or vice versa.

Hence, as one can see from the above example, the continuous tuning means would operate to vary the frequency for example, from 27.41500 MHz to 27.42000 MHz. Now, if the coarse frequency control is changed, for example, by moving the position of the fourth switch to the next higher frequency, one would now have to move the continuous tuning means back to the low frequency end of its range and then move the same from its low frequency extremity back to the high frequency end. As one can ascertain, this procedure is extremely time consuming and inconvenient.

The continuous tuning control which is employed in such receivers is desirably a multiturn potentiometer to enable increased ease in receiving a single sideband and other modes which require very accurate frequency settings. Hence, as one can ascertain, the use of such a control in going from the low frequency end to the high frequency end and back again each time the coarse control is moved, is completely undesirable.

It is therefore an object of the present invention to provide a circuit arrangement especially useful in wide band tunable generators to enable continuous tuning of the same to permit response to any frequency signal located within the low and high frequency limits of each step available by the coarse tuning switches.

Still a further object of the invention is to provide a continuous tuning arrangement for a variable frequency response circuit of the type covering a relatively wide frequency range. The response circuit includes a first frequency determining means that alters the frequency of the circuit from a low to the high limit of the range in a discontinuous manner as by switches and a second frequency determining means that is adapted to change the frequency continuous over the range of each alteration; which second circuit is coupled with the first means to eliminate the discontinuity which would otherwise occur upon a change in frequency.

BRIEF DESCRIPTION OF THE PREFERRED EMBODIMENT

In apparatus for providing a range of signals over a relatively wide frequency band by selecting one of a plurality of said signals in said band by means of a tunable frequency source, the combination therewith of apparatus for varying said selected frequency within a smaller predetermined range, comprising a controllable variable reactance means capable of providing a continuous variable output reactance which varies from a first value indicative of a first frequency to a second value indicative of a second frequency, selector means coupled to said variable reactance means to provide a reactance indicative of said first value and relatively independent of the previous controlled reactance of said variable reactance device, means coupling said variable reactance device to said tunable frequency source to enable variation of said frequency within said smaller predetermined band, whereby said reactance as varied will always cause the frequency as defined by said band to be controlled between said first and second values as determined by said selector means.

DETAILED DESCRIPTION OF DRAWINGS

Figure 1:
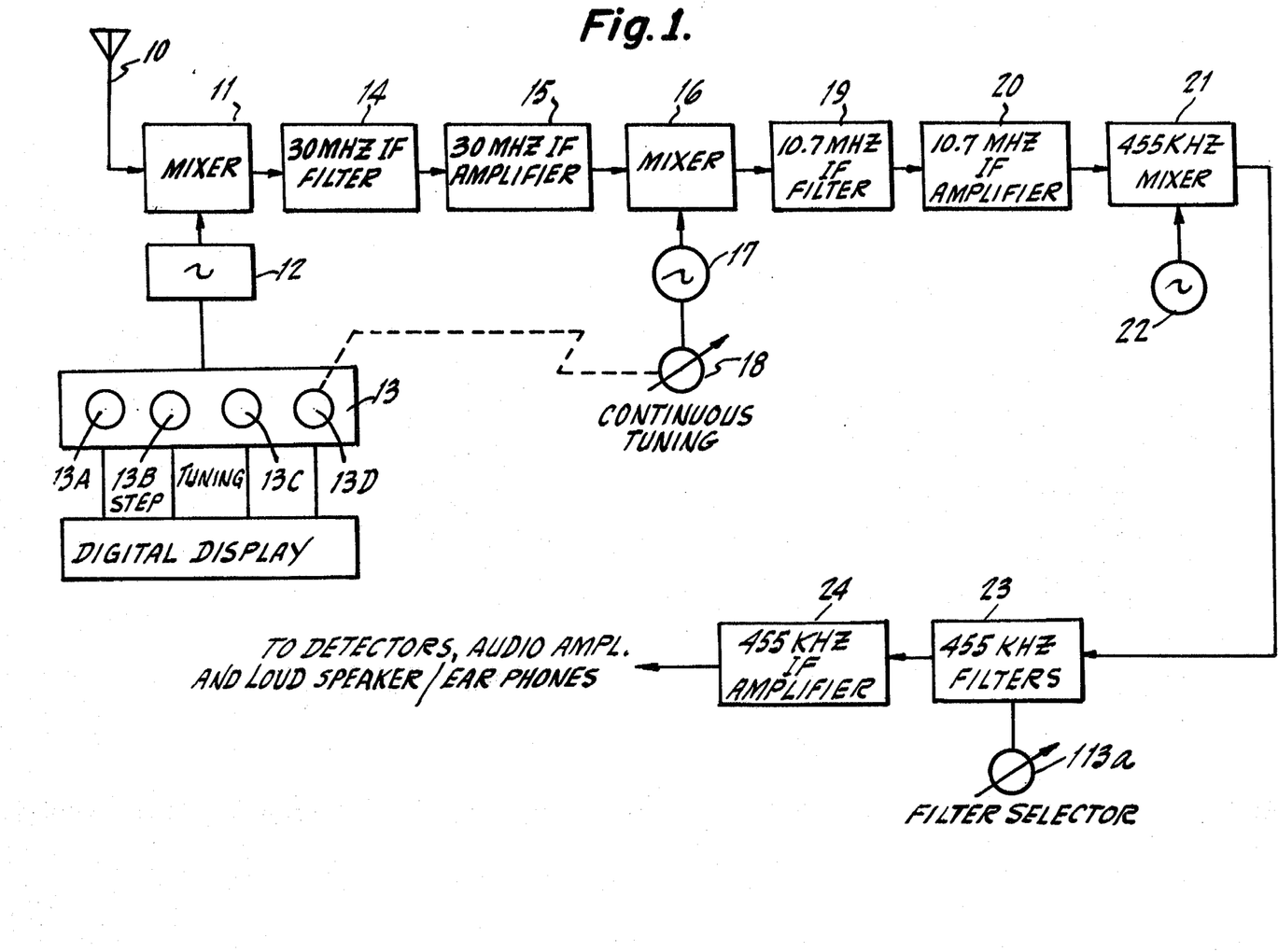
FIG. 1 is a block diagram of a receiving apparatus employing a continuous tuning control according to this invention.

In order to gain a clear understanding of the nature of the invention, there is shown a block diagram of a typical commercially available radio receiver which employs a synthesizer to effectuate coarse tuning. Essentially, the receiver shown in FIG. 1 is a digital type of superhetrodyne using a phase locked loop synthesizer to effectuate step tuning in 5 KHz intervals and includes additional means for continuous fine tuning within each 5 KHz range. It is this means for continuous tuning which emcompasses an embodiment of the invention to be described.

Before proceeding with an analysis of the operation of the receiver and the advantages of the invention, it is of course, understood that the ability to continuously tune over the 5 KHz interval to be described is a desirable feature in a signal generator as well as a radio receiver and it is well known that techniques for generating such signals, whether used for the local oscillator frequency of a receiver or used as a standard for test purposes as in a signal generator, present similar problems.

Particularly, the ability to tune over a 5 KHz interval in a radio receiver or over a relatively small interval is extremely desirable in modern commercial receivers. As indicated, such receivers employ a frequency synthesizer to generate the local oscillator signal which may be varied in discrete steps by means of suitable switches. The receiver includes a continuous tuning means to enable the user to tune the receiver over a particular range defined by one of the steps.

There are, of course, many examples of highly stable switchable step tuned receivers. See, for example, U.S. Pat. No. 2,501,591 entitled MULTIBAND SUPERHETRODYNE RADIO RECEIVER HAVING A PUSHBUTTON SELECTOR issued on Mar. 21, 1950 to H. M. Bach, the Inventor herein. See also U.S. Pat. No. 2,529,443 entitled MULTIBAND SUPERHETRODYNE RADIO RECEIVER HAVING A PUSHBUTTON STATION SELECTOR issued on Nov. 7, 1950 to H. M. Bach. Other patents such as U.S. Pat. No. 2,555,391 entitled RADIO OSCILLATOR CONTROL dated June 5, 1951 issued to H. M. Bach also show examples of highly stable step tuned receivers. Essentially, these receivers were adapted to receive broadcast signals which were spaced 10 KHz apart in the broadcast range of 535 to 1,600 KHz and also in the short wave range.

There have been substantial changes in frequency allocation and the short wave bands are now separated by 5 KHz. In the United States, the low frequency broadcast stations are spaced 10 KHz in the 535 to 1,600 KHz band, but in many countries outside the United States, the spacing is 9 KHz and this spacing may eventually be employed throughout the world. These factors together with the extensive use of single sideband suppressed carrier transmission has greatly increased the need for highly stable receivers. Hence, present receivers cover a frequency range of from 50 KHz to 30 MHz and include means for receiving and responding to AM, SSB, and CW signals.

The receiver depicted in FIG. 1 can accept an incoming signal via antenna 10 in the range of 50 KHz to 30 MHz. The signal is impressed upon the input of the mixer 11, preferably through selectable band pass filters which are not shown. The other input to the mixer 11 is derived from a local oscillator 12 which is of the programmable phase locked loop type and is under control of a programming switch unit 13.

In this receiver, a first switch 13A selects the 10 MHz position as zero, one and two. The second switch 13B selects the 1 MHz position as zero to nine. The third switch 13C selects the 100 KHz position as zero to nine and the fourth switch 13D is a twenty position switch which is indicative of 10 KHz intervals or tunable from zero to one hundred KHz in 10 KHz steps.

The switch 13D is coupled to the second oscillator 17 to enable the second oscillator to provide a continuous fine tuning in 5 KHz steps on alternate settings or positions of the switch 13D.

The synthesizers employed and controlled in the manner depicted in FIG. 1 are well known in the art and suitable examples of such switch controlled synthesizers are shown, for example, in a publication provided by the RCA Corporation and entitled RCA COS/MOS INTEGRATED CIRCUITS, Book Series SSD-203C (1975). An article on page 598 entitled LOW POWER DIGITAL FREQUENCY SYNTHESIZER UTILIZING COS/MOS IC'S depicts devices which are applicable for use in the receiver depicted.

The mixer 11 may be a double balanced type and the signal received from the antenna is combined with the local oscillator signal 12 to provide a composite wave at the output of the mixer having a 30 MHz component. This component is propagated through an IF filter 14 and subsequently amplified by the IF amplifier 15.

The output of the amplifier 15 is fed to one input port of a mixer 16. The mixer 16 which may also be a double balanced mixer receives a second input from a crystal controlled oscillator 17. In this particular example, the nominal frequency of oscillator 17 is 40.7 MHz. The oscillator 17 may be crystal controlled to provide stability and many examples of suitable oscillators are well known in the art.

Associated with oscillator 17 is a continuous tuning apparatus 18. Basically, the continuously tuning apparatus, as will be explained, comprises a variable reactance device which is a varactor diode or any device whose reactance varies upon application thereto of a varying voltage. Devices for providing variable reactance such as varactor diodes and so on are well known in the art and such devices will operate to continuously vary the frequency of the oscillator 17 according to the change in reactance. In this manner, the oscillator 17 can be varied by 5 KHz.

As indicated, the use of a variable reactance device to control the frequency of a crystal oscillator is well known in the art and examples of such apparatus can be had by referring to U.S. Pat. No. 2,440,886 issued on May 4, 1948 and U.S. Pat. No. 2,470,738 issued on May 17, 1949, both to H. M. Bach.

Thus, the output of the mixer 16 provides an output IF signal at a center frequency of 10.7 MHz which is applied to an IF filter 19, an IF amplifier 20 and thence to a mixer 21 where it is combined with a suitable reference frequency derived from source 22 to produce a 455 KHz signal at the output. This signal is conventionally sent to a 455 KHz filter assembly 23 and thence to suitable amplifiers 24. It is, of course, well known in the art on how to convert the 455 KHz IF signal to an audio signal for enabling the user to receive the incoming audio.

Essentially, as shown in FIG. 1, the continuous tuning means 18 which, as indicated, may include a varactor diode, is shown ganged or coupled to switch 13D so that continuous tuning may be affected to the receiver range without the additional manipulation of the continuous tuning control 18 after switch 13D has been changed or moved to an adjacent switch position.

In order to clearly describe the problem, a typical example will be given. Assume that the receiver is tuned by switches 13A, 13B, 13C and 13D to a frequency of 19.45000 MHz. By adjustment of the continuous tuning control 18, one can now vary the oscillator 17 to effectuate a 5 KHz change. Hence, the display will read for the above described setting, 19.45000 MHz.

The continuous tuning control 18 will enable the user to vary the frequency between 19.45000 KHz to 19.45500 KHz and the fifth digit will also be seen on the display. In doing so, the continuous tuning control 18 has been moved from the low frequency end to the high frequency end. This control, for example, may vary the bias on a varactor diode from its maximum capacitance to its minimum capacitance and therefore vary the frequency of oscillator 17 from a minimum frequency to a maximum frequency.

Experienced users of a receiver will also tune from the low frequency end to the high frequency end in order to cover the desired band. Hence, in so doing, the continuous tuning means 18 will be at its high frequency position or that position which affords minimum reactance to the controllable reactance device. The user will then normally move switch 13D to the next highest position to thereby increase the receiver frequency by a coarse step of 5 KHz. Upon so doing, the setting of the continuous tuning device 18 will also be at the high frequency position and hence, the operator will be required to rotate control 18 to its low position end and then proceed to tune from the low position end to the high position end before advancing switch 13D once more.

The control 18 is generally geared or otherwise arranged so that many turns of the continuous tuning control 18 are required to move the frequency continuously from its low to its high position. Hence, the manipulation of this control in a conventional receiver is very time consuming, but is required after each stepwise change of the coarse tuning switch 13D. In one embodiment, the continuous tuning control 18 is coupled to the switch 13D and apart from controlling the oscillator 17 in 5 KHz intervals, operates to reverse the bias on control 18. Therefore, the bias impressed upon the tuning control 18 is reversed each time the coarse tuning control is rotated. In this manner, the bias on the variable reactance device automatically adjusts from a high frequency condition back to a low frequency condition each time the coarse control 13D is actuated. Accordingly, the operator will go from the low frequency end to the high frequency end of the oscillator 17 in a clockwise position for a first setting of switch 13D. As the switch 13D is advanced to a higher frequency position, the user merely turns control 18 counterclockwise to enable him to now go from the low frequency position to the high frequency position. This operation is under control of the setting of the coarse frequency switch 13D and hence, eliminates the above described problem in forcing the user to manipulate the continuous tuning control 18 for each actuation of the switch 13D.

Figure 2:
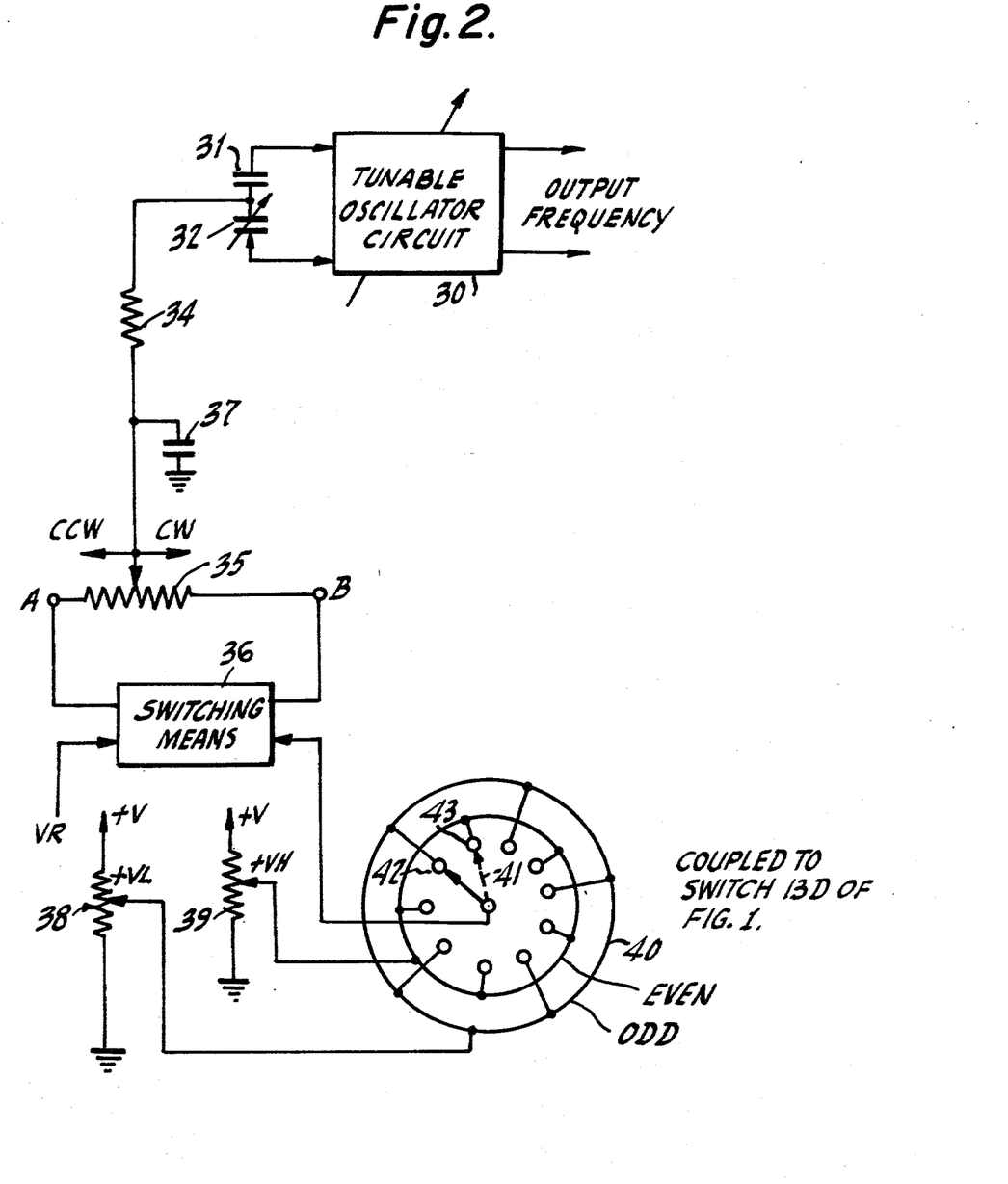
FIG. 2 is a block diagram showing a tuning control circuit which can be employed in a receiver as depicted in FIG. 1.

Referring to FIG. 2, there is shown a simplified schematic diagram of a continuous tuning mechanism as 18 of FIG. 1 to be employed in conjunction with a tunable oscillator as 17 of FIG. 1. A tunable oscillator circuit 30 is shown in block form. Essentially, as above indicated, there are numerous examples of oscillators in the prior art which can be employed for oscillator 30. Such devices include crystal control oscillators and other stable configurations which can be employed and used as oscillator 17 of FIG. 1.

Shown coupled across the reactance circuit of the oscillator is a reactance circuit consisting of capacitor 31 in series with a varactor diode 32. Basically, the capacitor 31 and varactor 32 are coupled across the reactance circuit of oscillator 30 and the combined capacitance operates to determine the operating frequency of the oscillator 30.

Essentially, the varactor diode 32 is a relatively small area junction diode which is designed to utilize the basic variation of junction capacitance as a function of applied voltage. With an abrupt junction as is employed in most varactor diodes, the junction capacitor of the diode varies inversely as the square root of the reverse voltage. There are many types of varactor diodes available and employed and such devices have fairly wide capacitance ranges with realtively low series resistance.

Coupled to the junction between capacitor 31 and the cathode of diode 32 is one terminal of a resistor 34 which has its other terminal coupled to the variable arm of a control potentiometer 35. The control potentiometer 35 is analogous to the continuous tuning control 18 of FIG. 1 and as will be explained, the control potentiometer 35 operates to vary the bias on the varactor diode 32 to thereby vary its reactance.

A capacitor 37 is shown coupled to the junction between resistor 34 and the variable arm of potentiometer 35. Essentially, capacitor 37 and resistor 34 act as a low pass filter to prevent any RF present at the junction between capacitor 31 and varactor 32 from being coupled to the movable arm of the potentiometer 35.

As shown in FIG. 2, one terminal of the potentiometer designated as A is coupled to one input of a selectable switch means 36. The other terminal of the potentiometer designated as B is connected to another input of switching means 36.

As will be explained, the switching means 36 may comprise a double pole, double throw switch or may be a semiconductor switch or a relay configuration which is capable of providing the function to be described.

There is shown a first potentiometer 38 and a second potentiometer 39. Each potentiometer has one terminal connected to ground or a source of reference potential and the other terminal is connected to a relatively stable direct potential source designated as +V.

The variable arm of potentiometer 38 is coupled to a plurality of first terminals (ODD) associated with a rotary switch section 40. The variable arm of potentiometer 39 is coupled to a plurality of terminals (EVEN) also associated with rotary switch section 40. The rotary switch 40 is mechanically ganged or coupled to the switch 13D as shown in FIG. 1, which as indicated, is a twenty position switch capable of coarse tuning the oscillator 12 in 10 KHz increments. Hence, the switch section 40 may be a wafer located on the same shaft as the switch 13D and for each rotation of switch 13D, switch 40 is similarly rotated. For convenience switch 40 is shown as a 10 rather than a 20 position switch.

The central arm 41 of switch 40 is coupled to the input of the switching means 36. Also shown coupled to the input of switching means 36 for purposes of explanation, is a reference potential designated as VR.

The circuit operates as follows: Switch 41 is shown coupled to terminal 42; which terminal 42 is also coupled to the variable arm of potentiometer 38 designated as VL. Assume, in this example, that the operator has rotated switch 13D and therefore switch 40 to the position shown. Switch means 36 is now in a first postion. In this postiion, the potential at terminal A is +VL which is the potential at the variable arm of potentiometer 38 and the potential at terminal B is +VR which is the reference potential.

For purposes of this explanation, assume that +VL is set to be at a lower potential than VR. Hence, as potentiometer 35 is moved from terminal A to terminal B at the setting shown, the voltage on the varactor diode will increase and therefore, the capacitance will decrease. This in turn causes the frequency of the oscillator 30 to go from a low value to a high value or from a low point to a 5 KHz increment. When the variable arm of potentiometer 35 is at terminal B, the frequency of the oscillator 30 is maximum.

Now assume that the operator moves switch 13D and therefore switch 40 from position 42 to position 43. It is first noted that the potentiometer 35 remains at terminal B. It is now noted that terminal 43 which is now in contact with the arm 41 of switch 40, supplies the potential +VH to the switching means 36. This potential +VH is now applied to terminal B by the switching means 36 and the potential VR is switched to terminal A. Potential VR is greater than potential VH.

Hence, for the increase of frequency provided by moving the coarse tuning switch, one increment, the switching means 36, has altered the potentials at terminals A and B of the potentiometer 35. In this manner, the frequency of the oscillator 30 with the potentiometer at position B, is now at the low frequency end and as the potentiometer is now moved to position A, the frequency of the oscillator 30 again is increased as before.

One can therefore ascertain that each time the arm 41 of the switch 40 is rotated, the potential at terminals A and B automatically change so that the user may move the arm of potentiometer 35 in the opposite direction and still tune the oscillator frequency from a low to a high value. Hence, as can be ascertained, each time the frequency is increased by the rotation of switch 40, the switching means 36 operate to assure that the potentials on terminals A and B of potentiometer 35 are correct to enable the user to continue to tune the receiver to a higher frequency by movement of the switch to the left or right alternately or clockwise or counterclockwise, as desired. This thus avoids the tremendous amount of wasted effort and actual manipulation required by the implementation of continuous tuning controls as presently provided in conventional receivers and signal generators.

In actual practice, one requires two potentials in lieu of VR because the frequency and reactance changes are different and a slight change in any parameter will cause a gap in the frequency covered. For example, if one desires to tune the receiver from 40.700 MHz to 40.705 MHz, the change is different than to go from 40.705 MHz to 40.710 MHz. As indicated, the switch 13D serves to increase the frequency of oscillator 17, 5 KHz when the switch is set from a 00 to 05 increment and the frequency of the oscillator 17 is reduced 5 KHz when the switch is set from a 05 to a 10 position and so on. In either case, the variable tuning control moves 5 KHz higher from counterclockwise (CCW) to clockwise (CW) when switching means 36 is in the normal position and 5 KHz higher from clockwise (CW) to counterclockwise (CCW) when switching means 36 is in the reverse position.

Figure 3:
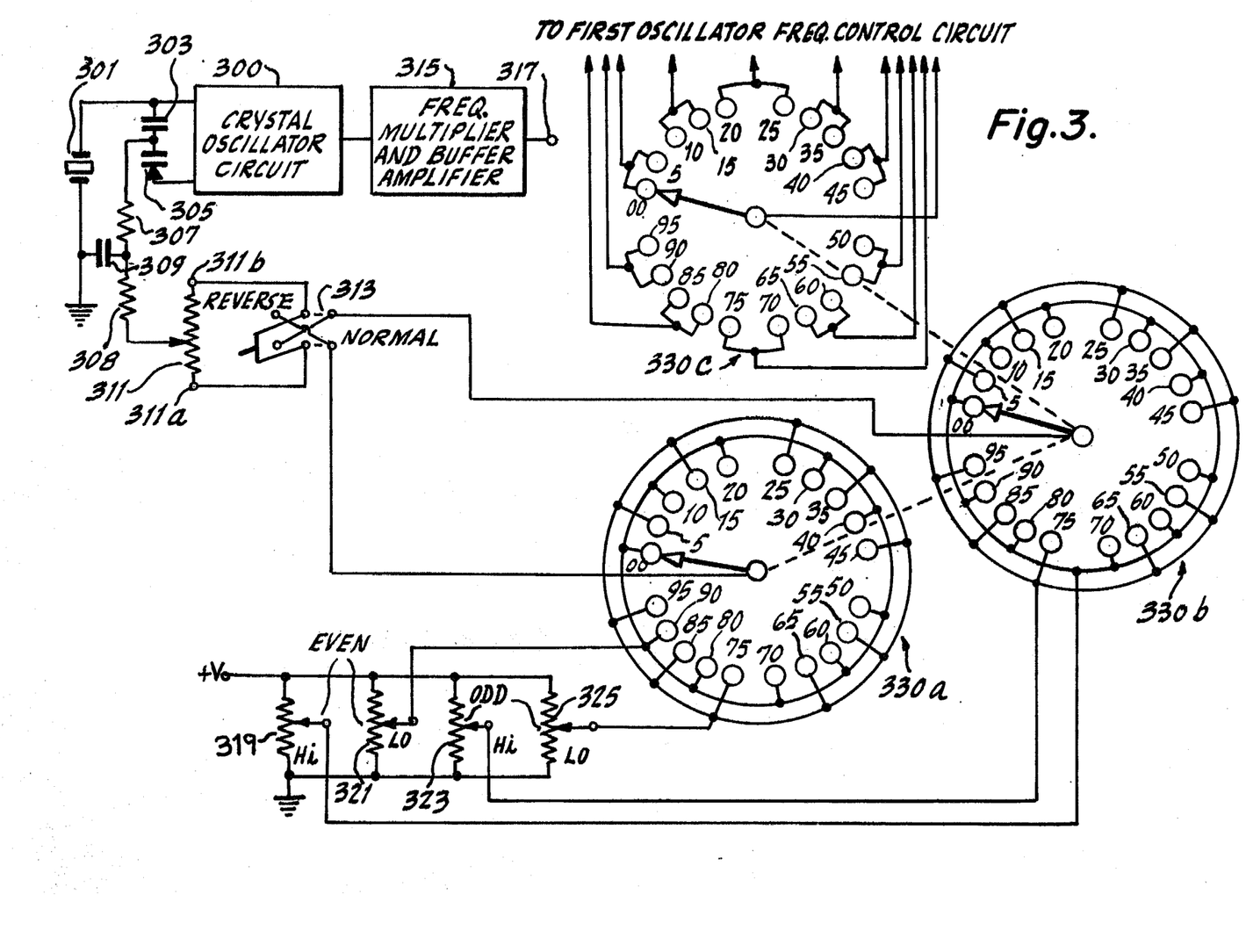
FIG. 3 is a block diagram partially in schematic form of an alternate embodiment of a tuning control according to this invention.

Referring to FIG. 3, there is shown a typical circuit which employs an actual switch configuration such as have been employed to vary the frequency of a receiver according to the block diagram of FIG. 1. Again the block designated as 300 includes a conventional crystal oscillator circuit. A quartz crystal 301 and a varactor diode 305 are again depicted outside the block 300 for convenience in describing the operation of the invention.

A capacitor 303 is used to isolate the direct current from the alternating potential developed across the varactor 305 and the input 301. Resistors 307 and 308 and capacitor 309 supply the direct potential for controlling the value of the capacitance of varactor 305 and further serve as a low pass filter to block the RF potential at the junction of capacitors 303 and 305 from potentiometer 311.

Switch 313 is a conventional two position (double pole, double throw dpdt) toggle switch. The center arms of the switch 313 are connected respectively to the end terminals 311A and 311B of potentiometer 311. When the switch 313 is in the normal position, terminal 311A connects through 313 to the moving arm of the first section of the twenty position rotary switch 330A and terminal 311B connects through 313 to the moving arm of a second section 330B of a twenty position rotary switch. A third section 330C is also shown in the diagram and this section is coupled to the oscillator 12 as of FIG. 1 to afford the coarse control at 10 KHz increments as indicated.

When switch 313 is placed in the normal position, terminal 311A is connected to the moving arm of the first section of the twenty position rotary swtich 330A and terminal 311B is connected through switch 313 to the moving arm of the second section 330B. As can be seen, the zero and even portions of each section are connected together and are connected to the setup potentiometers 321 and 319. The variable arm of potentiometer 319 is coupled to 330B and the arm of 321 is coupled to 330A. In a similar manner, the odd portions of each switch section are joined and are connected in the case of section 330B to potentiometer 323 and in the case of 330A to potentiometer 325. The end terminals of the four potentiometers are shunted in parallel across a regulated direct potential source designated as +V.

The setup adjustment of these potentiometers is such that for the even positions (including the zero position), the arm of potentiometer 311 is set at its most counterclockwise setting or to the extreme left and is at the potential of terminal 311A. Switch 313 is in the normal position and potentiometer 321 is adjusted to provide a frequency which is a few hundred cycles below the frequency corresponding to the setting of the ganged switches 330A, 330B, and 330C. Then, the switch 313 is placed in the reverse position. This places potentiometer 319 in the circuit and this potentiometer is adjusted to provide a frequency a few hundred cycles above the next higher or next odd position on the ganged switch.

In actual practice, there is a slight amount of interaction between these adjustments and this may be repeated for a second order touchup adjustment, whereby potentiometer 321 is adjusted for the desired low setting (switch 313 in its normal position) and adjusting potentiometer 319 for the desired high setting with switch 313 in its reverse position. Then the ganged switches 330A, 330B, and 330C are moved to an odd position. The switch 313 is in its normal position with the arm of potentiometer 311 set at terminal 311A. At his setting, the potentiometer 325 is adjusted to provide a frequency corresponding to the odd digit on the ganged switch, less a few hundred cycles.

For example, if the (05) zero five position of the ganged switch were selected, the readout on the display would indicate 04.8 KHz. Accordingly, if switch 313 is placed in the reverse direction, the potentiometer 323 is adjusted to provide a frequency a few hundred cycles above the next higher even position of the ganged frequency selector switch 330A, 330B and 330C.

The reason for the adjustment of a few hundred cycles under and over as described above is that 5 KHz increment is in part determined by the adjustments of the setup potentiometers, the stability of the potential source, the stability of the voltage capacitance characteristics of the varactor 305, and the overall stability, for example, of the crystal 301 and the oscillator circuit 300. All of these factors vary to a degree as a function of aging, temperature, line voltage and so on. It is for this reason that four potentiometers, rather than two or three, are used.

It is noted that the settings of potentiometers 319 and 325 are almost identical, but the settings of the other potentiometers 321 and 323 differ by a volt or more. This, therefore, provides the necessary overlap and the 5 KHz step increase.

It can thus be seen from FIG. 3 that a user merely has to reverse the switch 313 each time the ganged switch 330A, 330B and 330C is advanced. This again eliminates the above described problems and allows one to always tune from low to high frequency in either a clockwise or counterclockwise direction or vice versa.

It is, of course, understood that the switch 313 could be automatically controlled and hence, one could employ a relay or a semiconductor switching arrangement which would alternate between the reverse and normal positions each time the ganged switch was advanced. Arrangements for accomplishing this by automatic means should be well within the skill of an ordinary practitioner.

It is, of course, understood that the switch 313 could also be replaced by reversing the adjustment of potentiometers 323 and 325. Hence, if potentiometer 323 is used to adjust for the low frequency and 325 for the higher frequency, then one could obtain a frequency increase for a clockwise rotation of potentiometer 311 for the zero and even frequency portions of the ganged switch and also a frequency increase for the counterclockwise rotation of potentiometer 311 for the odd frequency portions of the ganged switch. This elimination of switch 313 is satisfactory for use with SSB and CW transmissions, if the operator wishes to employ continuous scanning or tuning.

However, for tuning the short wave AM broadcast bands, the switch 313 or its equivalent is preferred, since it is then possible to dispense with the continuous tuning and move the receiver in 5 KHz increments by the use of the ganged switches 330A, 330B, and 330C. This, of course, is not possible if switch 313 is removed and the above described adjustments made. Additionally, the switch 313 is advantageous in adjusting the setup potentiometers since in the absence of the switch, it is necessary to turn the potentiometer 313 from fully counterclockwise or left to fully clockwise or right before an adjustment and then back again before the next adjustment.

As indicated above, due to the fact that one is employing a helipot or a multiple turn potentiometer for 311, such adjustments are extremely time consuming and hence, the use of switch 313 eliminates such difficulties.

It has thus been shown that the circuit above described provides that the changing of a coarse frequency control switch causes the sense of rotation of the continuous tuning control to reverse its sense of frequency change. In this manner, a clockwise roation of the potentiometer increases the frequency on the zero and even positions for a ganged switch and on the odd number positions, a counterclockwise rotation increases the frequency. Accordingly, the frequency may be continuously adjusted without having to tune the continuous frequency dial ten or more times back and forth from a start to a stop position at each actuation of the coarse frequency control. This aspect of providing continuous and rapid tuning from a higher to a lower frequency for a receiver or a generator is extremely convenient and greatly facilitates the use of such devices.

Figure 4:
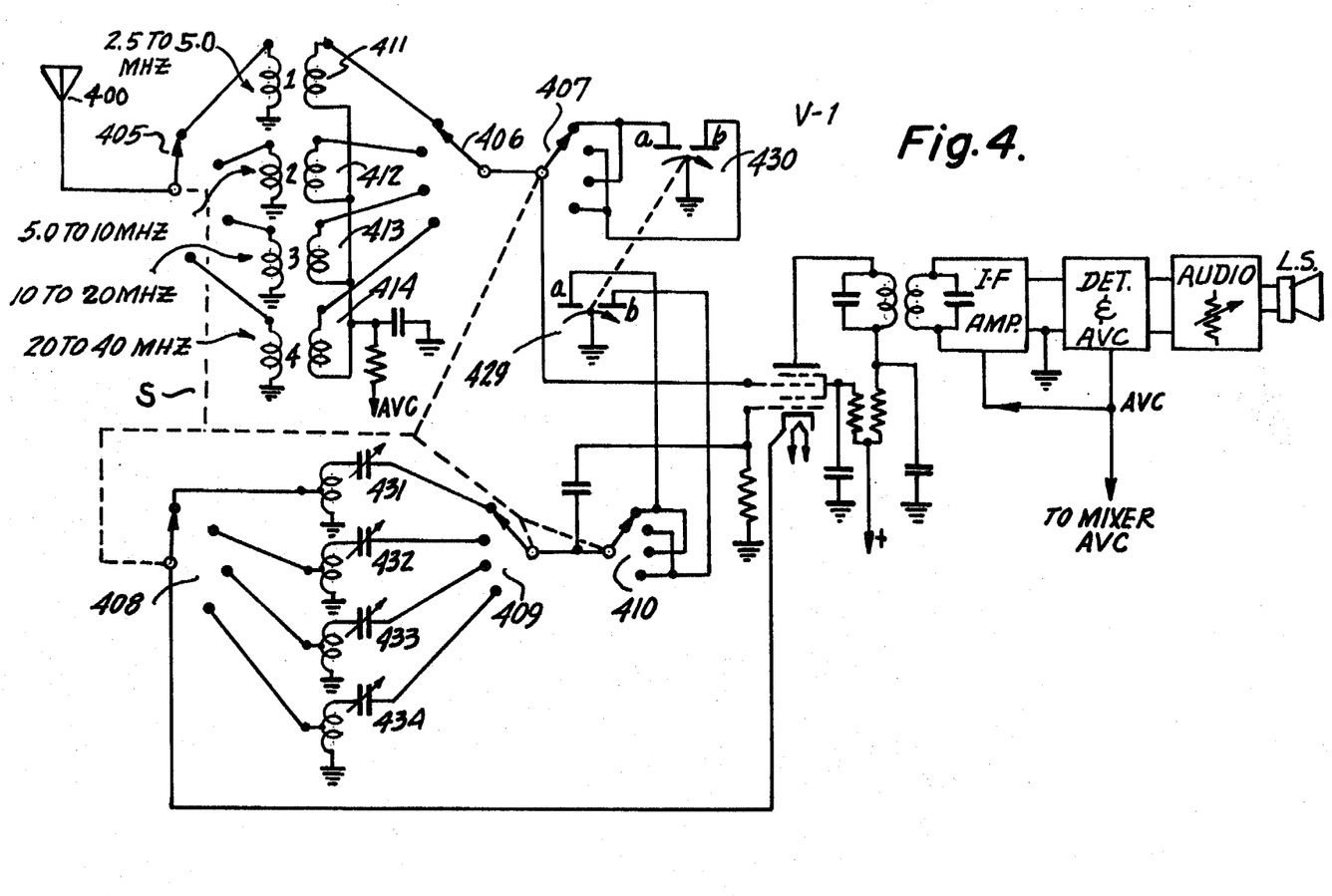
FIG. 4 is a block diagram partially in schematic form of a superhetrodyne receiver employing continuous tuning means according to this invention.

Referring to FIG. 4, there is shown in block diagram form, a conventional multiband receiver of the superheterodyne type which employs an alternate embodiment encompassing the basic principles of the invention. By way of illustration, the receiver of FIG. 4 is designed to cover four adjacent frequency bands. Band 1 at 2.5 to 5 MHz, Band 2 at 5-10 MHz, Band 3 at 10-20 MHz and Band 4 at 20-40 MHz.

Coarse frequency selection of the incoming RF signal as received by antenna 400 is accomplished by a six pole ganged four position switch S having switch sections 405, 406, 407, 408, 409 and 410 and which connect the input transformers 411, 412, 413 and 414 to one stator of a differential tuning capacitor 430.

There is shown local oscillator tank circuits 431 to 434 which are connected to a differential tuning capacitor 429 which is ganged with capacitor 430. Capcitors 430 and 429 are differential capacitors which can be varied. Such capacitors have a pair of stators; each of which comprise a plurality of in-line spaced flat metal plates. The stators are insulated from each other.

A rotor is comprised of a plurality of flat substantially semicircular shaped spaced metal plates which are spaced and positioned with respect to the stator plates. As the rotor is rotated about a 180° arc, the plates of the rotor start by fully engaging or meshing with the first stator A and upon angular rotation, disengage the first stator more and more until at the 180° rotation position, the second stator B is fully engaged or meshed and the first stator A is fully disengaged or unmeshed.

Thus, it can be seen that an arrangement employing a differential capacitor can provide continuous tuning from the low frequency extreme to the high frequency extreme with a range defined by each position of a switch. Thus, a differential tuning capacitor can be employed in lieu of the above described varactor so that one of the stators is in circuit for the odd number positions and the other stator will be in circuit for the even number positions.

In FIG. 4, the signal input is fed via the antenna 400 to the primary of a selected transformer as 411 to 414 via the switch section 405. The secondary of the transformer 411, for example, is fed via switch 406 and 407 to a selected stator of the differential tuning capcitor 430 and thence, to a suitable grid of the mixer tube V-1. The output of the mixer tube V-1 is fed via suitable transformers to the IF amplifier and thence, to a detector and audio circuits as conventionally exist in a superhetrodyne receiver.

The mixer tube V-1 also receives an input at its first grid circuit from a selected tank circuit 431 to 434 via switch section 409. The differential tuning capacitor 429 which is ganged to capacitor 430 is used to tune the tank circuits 431 to 434 and to cause oscillations over a range as determined by variation of the capacitor 429. The operation of an oscillator mixer tube together with suitable tank circuits and tuning means is known in the art.

In any event, starting at the low frequency extreme of the first band (2.5 to 5 MHz), the secondary winding of input transformer 411 is tuned by capcitor 430A from its maximum capacitance value to its minimum value; a change of four to one in capacitance. The values of the reactances of the secondary winding of transformer 411 and of variable capacitor 430A are selected to be resonant from 2.5 to 5 MHz. When the 5 MHz resonant frequency is reached, section 430A is fully unmeshed (at its lowest capacitance setting) and section 430B not in circuit when tuning the first frequency band, is at its maximum capacitance setting. The ganged switch S is then moved to its second setting (5 to 10 MHz). 430B now is in circuit with transformer 2, tuning it to 5 MHz, and the tuning control now adjusts 430B from its maximum to its minimum capacitance, which changes the resonant frequency of transformer 2, from 5 to 10 MHz.

In a similar manner, the oscillator tank circuits 431 to 434 and capacitor 429A and 429B adjust the local oscillator frequency to be at a frequency above the resonant frequency of the input transformers 411 to 414 by the frequency of the IF amplifier.

Thus, it is seen from FIG. 4 that as the band switch is activated from one band to the next adjacent higher band, the tuning control is positioned automatically to start tuning without having to be turned back from its previous highest frequency setting to its previous lowest frequency setting. This is very important as above indicated and is especially important when the tuning is geared down, which therefore requires many turns of the tuning knob to rotate the tuning capacitor.

In short wave listening, when the operator is interested in learning what is being received, it is always best to practice to sweep through the range of the receiver from low to high frequencies to obtain an idea of the current skip in each direction and hence, the maximum usable frequency (MUF).

Additionally, when tuning suppressed carrier single sideband signals (SSB), it is easier to tune always from the same side as from low to high. In a similar manner, when tuning CW signals with an offset local beat frequency oscillator to eliminate one side of a zero beat as is conventional, the same low to high method of tuning is highly desirable.

In all respects, it is preferable then to perform tuning in a receiver or in a generator from the low to high frequency end on a continuous basis and to do so without the necessity of returning the tuning controls to a start position prior to effectuating the desired tuning.

Hence, the embodiments depicted in FIG. 4 show a receiver of the superhetrodyne type wherein tuning is always accomplished from a low to a high band by employing variable differential capacitors. Such capacitors are available and known in the prior art and are supplied by many manufacturers. In a receiver as depicted in FIG. 1, for example, continuous tuning is also supplied from a low frequency to a high frequency by the use of a varaible reactance device which can be a differential capacitor.

An alternate embodiment as depicted in FIGS. 2 and 3 show means for altering a control potential at the output terminals of a tuning control to assure that movement of the control from one end to the other end will always result in an increase in the tuning frequency to thereby eliminate the problems associated with readjusting the tuning control to a start position for an increase in the range of operation of the receiver or the generator.

While the above techniques are representative of structure which will operate in accordance with the principles of this invention, it is understood that the concepts disclosed herein are not limited to the specified circuits and arrangements of parts which are shown and disclosed for illustration. It is understood that the underlying concept and principles of this invention are susceptible to numerous variations and modifications; some of which have been indicated above. It is therefore realized that one can replace the switching means of FIG. 3 by automatic circuity which may include a semiconductor switch or a relay configuration which will alternate the potentials automatically between odd and even frequencies as specified by the coarse tuning controls of the receiver or generator.

It is further understood that various other reactance devices can be employed in lieu of varactor diodes or differential capacitors and such devices may include active reactance circuits as well as current controlled variable inductors.

I claim:
1. A variable frequency generator, comprising:
   (a) a tuning control means including a controllable oscillator means coupled thereto for providing an output frequency which is continuous varied from a first to a second frequency by moving said control means from a first limit position to a second limit position according to a given control value specifying the magnitude of said output frequency within a given range,
   (b) actuatable means coupled to said tuning control means and operative when actuated to abruptly alter said control value to enable continuous tuning of said oscillator means from either said first to said second frequency or from said second to said first frequency by moving said tuning control means between the same limits to therefore vary said magnitude of said output frequency always within said given range, whereby said output frequency may be continuously varied by said tuning control means either from the first to the second frequency or from said second to said first frequency consecutively without either the necessity of continuously varying said output frequency from said second frequency to said first frequency or from said first to said second frequency.

2. The variable frequency generator according to claim 1 wherein said oscillator means includes a frequency synthesizer operative to select any one of a plurality of frequencies by means of a series of selector switches operative to control a tunable frequency source, each of said switches indicative of a digit of said frequency as selected.

3. In apparatus for providing a range of signals over a relatively wide frequency band by selecting one of a plurality of said signals in said band by means of a tunable frequency source, the combination therewith of apparatus for varying said selected frequency within a smaller predetermined range, comprising:

(a) a controllable variable reactance means capable of providing a continuous variable output reactance which varies from a first value indicative of a first frequency to a second value indicative of a second frequency, (b) selector means coupled to said variable reactance means to provide a reactance indicative of one of said values and relatively independent of the previous value of the reactance of said variable reactance device.

(c) means coupling said variable reactance device to said tunable frequency source to enable variation of said selected frequency within said smaller predetermined band whereby said reactance as varied will always cause the frequency as defined by said band to be controlled between said first and second values as determined solely by said selector means to cause said selected frequency to be continuously varied by said reactance means from said first frequency to said second frequency consecutively without the necessity of continuously varying said output frequency from said second frequency to said first frequency.

4. The apparatus according to claim 3 wherein said tunable frequency source is coupled to a plurality of selector switches at least one of which is moveably operative to select at least one digit indicative of said selected frequency.

5. The apparatus according to claim 4 wherein said variable reactance means includes a variable reactance device capable of being continuously tuned from said first value to said second value by means of a variable source of potential coupled to said reactance device and operative to vary said reactance from said first value to said second value by application thereto of said potential varying from a first level to a second level, and control means responsive to the movement of said at least one of said selector switches including switching means coupled to said at least one selector switch and operative to alter said source of potential to cause said first level to be first applied to said reactance device when said selector switch is moved to a higher frequency position, whereby said reactance device will always vary said frequency from a lower to a higher value within said band.

6. The apparatus according to claim 4 wherein said relatively wide frequency band encompasses the range between 50 KHz to 30 MHz as employed in radio reception.

7. The apparatus according to claim 4 further comprising a potentiometer having a first and second terminal with a variable control arm capable of being varied between said first and second terminals, said variable control arm coupled to said varactor diode, a first potential source for providing a potential indicative of said first level, and a second potential source for providing a potential indicative of said second level, switching means having a first input coupled to said first potential source and a second input coupled to said second potential source, said switching means having an output terminal coupled to at least one of said terminals of said potentiometer, and means responsive to the movement of said selector switch to cause said switching means to provide either said first or second level to said potentiometer terminal to therefore cause said varactor to vary said capacitance, always to provide a higher frequency during one position of said selector switch when said arm is moved towards said coupled potentiometer terminal, and during another position of said selector switch when said arm is moved away from said coupled terminal.

8. The apparatus according to claim 3 wherein said variable reactance means includes a differential capacitor of the type having a first section capable of providing a reactance from a high to a low value and a second section capable of providing a reactance from a high to a low value, and means responsive to said selector means to selectively couple said first or second section to said tunable frequency source.

9. The apparatus according to claim 3 wherein said variable reactance device is a varactor diode of the type exhibiting a change in junction capacitance according to the application thereto of a varying potential.

10. In a radio receiver of the type employing a first local oscillator for application of an output signal to a mixer to provide a first IF frequency, said first local oscillator being of the type tunable over a relatively wide band of frequencies indicative of a broadcast band by means of programmable switches capable of being selected to specify the frequency of said oscillator within a predetermined number of significant places according to the settings of said switches, said receiver including a second mixer responsive to said first IF and a second source of oscillations to provide at an output a second IF signal, the combination therewith of apparatus for varying the frequency of said second source of oscillations within a smaller predetermined range indicative of said least significant places of said first oscillator frequency as selected, and to vary said frequency within said range from a lower to a higher value, comprising:

(a) a tunable variable reactance means coupled to said second oscillator and capable of providing a continuous variable output reactance which varies from a first value indicative of a low frequency to a second value indicative of a higher frequency to therefore vary said second oscillator within said range from a low to a high frequency, (b) means responsive to a directional movement of at least one of said programmable selector switches indicative of said least significant places of said specified frequency to cause said reactance to provide said first value when the direction of said selector switch movement specifies an increase in frequency to thereby allow a user to tune said second oscillator from said low to high frequency relatively independent of the previous tuned condition of said variable reactance means.

11. The apparatus according to claim 10 wherein said variable reactance means includes a varactor diode coupled to said second oscillator and capable of varying the frequency upon application to said varactor of a suitable control voltage.

12. The apparatus according to claim 10 further including a potentiometer having a first and a second terminal and a variable arm movably positioned between said terminals, said arm being coupled to said varactor, switching means responsive to the movement of said at least one selector switch, said switching means coupled to one of said terminals of said potentiometer to provide a first operating potential thereto when said selector switch is in one frequency position to cause said reactance to vary said oscillator frequency from a low to high value when said arm is moved towards said one terminal, and to provide a second operating potential to vary said oscillator frequency again from said low to high value when said arm is moved away from said one terminal when said selector switch is in another frequency position.

13. A variable frequency response circuit for providing a range of signals over a relatively wide frequency band, said circuit including a plurality of switches operative to control a tunable frequency source to enable selection of any one frequency within said band by said switches being set to a value indicative of said frequency, the combination therewith of apparatus for varying said frequency as selected within a predetermined smaller range and always from a lower to a higher value independent of said frequency as selected, comprising:
(a) a tuning control operative to provide a control signal upon movement of the same from a first to a second position,
(b) variable reactance means coupled to said tuning control and operative to provide a variable reactance when said control is moved from said first to said second position manifesting a continuous change in reactance from a first to a second level,
(c) means coupling said variable reactance means to said tunable oscillator to vary said frequency within said predetermined smaller range according to said change in reactance,
(d) switching means responsive to the movement of one of said selector switches and coupled to said tuning control to alter said control signal when said selector switch is moved to a higher frequency position to cause said tuning control as operative to vary said reactance from said first to said second level upon movement of said control from said second to said first position and according to the direction of movement of said selector switch, whereby said tuning control is always operative to vary the frequency as selected within said range from a lower to a higher value.

14. In apparatus for providing a range of signals over a relatively wide frequency band by selecting one of a plurality of said signals in said band by means of a plurality of selector switches operative to control a tunable oscillator, each of said switches indicative of a digit of said frequency as selected, said apparatus including a tuning control operative to increase the frequency of said oscillator in a first direction and to decrease the frequency in a second direction to cause said frequency as controlled to undesirably remain at a higher frequency when one of said selector switches is moved to a higher frequency selector position, whereby said tuning control has to be returned to a start position indicative of a lower frequency to permit tuning to a higher frequency in said first direction, the combination therewith of apparatus for varying said selected frequency by said tuning control within a smaller predetermined band from a lower to a higher value without returning said control to a start position, comprising:
controllable reactance means coupled to said tuning control and having an output terminal coupled to said oscillator, said reactance means responsive to the operation of said selector switch to said higher frequency position, for varying the frequency of said oscillator from a low to a higher frequency during a first position of said selector switch by controlling said reactance by operating said tuning control in said first direction and for varying the frequency of said oscillator also from a low to a higher frequency during a second position of said selector switch by controlling said reactance by operating said tuning control in said second direction, whereby the frequency of said oscillator will always be at a lower frequency when said one selector switch is moved to said higher frequency position to enable tuning of said oscillator from said low to said higher frequency in either of said first or second directions according to the setting of said one selector switch.

15. A method of varying the generated frequency of a variable oscillator comprising the steps of:
(a) continuously moving a tuning control coupled to said oscillator from a first to a second limit to cause said oscillator to vary its output frequency continuously from a first frequency to a second frequency,
(b) abruptly altering a control value for said oscillator to enable tuning from said first to said second frequency by moving said tuning control from said second to said first limit whereby the generated frequency may be varied continuously from said first to said second frequency consecutively without the intermediate step of continuously varying the generated frequency from the second frequency to the first frequency.

16. In combination with a variable frequency generator of the type capable of providing a variable output frequency according to the adjustment of a tuning control apparatus for varying the output frequency within a predetermined range, comprising therewith:
(a) a tuning control means coupled to said generator and operative in a first direction to vary said output frequency from a first low frequency to a second higher frequency manifesting said predetermined range by operating said tuning control continuously from a first limit position to a second limit position, said tuning control means operative in a second direction to vary said output frequency from said second higher frequency to said first low frequency by operating said tuning control from said second to said first limit position,
(b) actuatable control means in circuit with said tuning control means and adapted upon actuation, to enable said tuning control means to reverse directions to therefore vary the output from said second to said first frequency upon movement of said tuning control means continuously from said first limit position to said second limit position and to vary the output from said first to said second frequency continuously from said second limit position to said first limit position, whereby the direction of tuning between said first and second frequencies is altered by said actuatable control means.

* * * * *